United States Patent
Kurihara et al.

(10) Patent No.: US 7,429,791 B2
(45) Date of Patent: Sep. 30, 2008

(54) SEMICONDUCTOR DEVICE IN A RESIN SEALED PACKAGE WITH A RADIATING PLATE AND MANUFACTURING METHOD THEREOF

(75) Inventors: Toshimichi Kurihara, Tokyo (JP); Takashi Ueda, Shiga (JP)

(73) Assignee: NEC Corporation, Tokyo (JP)

( * ) Notice: Subject to any disclaimer, the term of this patent is extended or adjusted under 35 U.S.C. 154(b) by 1262 days.

(21) Appl. No.: 09/942,445

(22) Filed: Aug. 30, 2001

(65) Prior Publication Data

US 2002/0025606 A1 Feb. 28, 2002

(30) Foreign Application Priority Data

Aug. 31, 2000 (JP) .............................. 2000-264084

(51) Int. Cl.
*H01L 21/00* (2006.01)
(52) U.S. Cl. ..................... 257/712; 257/713; 257/715
(58) Field of Classification Search ................ 257/675, 257/693, 712, 713, 715; 438/111, 122, 123
See application file for complete search history.

(56) References Cited

U.S. PATENT DOCUMENTS

| | | | |
|---|---|---|---|
| 3,767,839 A | 10/1973 | Beal | |
| 4,510,677 A | 4/1985 | Collumeau | |
| 4,649,460 A | 3/1987 | Marchisi et al. | |
| 4,925,024 A * | 5/1990 | Ellenberger et al. | 206/328 |
| 5,266,739 A | 11/1993 | Yamauchi | |
| 5,270,262 A * | 12/1993 | Switky et al. | |
| 5,653,891 A * | 8/1997 | Otsuki et al. | 216/11 |
| 5,739,582 A * | 4/1998 | ElHatem et al. | 257/676 |
| 5,757,075 A | 5/1998 | Kitaoka | |
| 5,828,126 A * | 10/1998 | Thomas | 257/695 |
| 6,396,133 B1 * | 5/2002 | James | 257/675 |

FOREIGN PATENT DOCUMENTS

| | | |
|---|---|---|
| GB | 1 318 821 | 5/1973 |
| JP | 50-133860 | 4/1949 |
| JP | 56-23765 | 3/1981 |
| JP | 63-124748 | 8/1988 |
| JP | 6-21303 | 1/1994 |
| JP | 07-045802 | 2/1995 |
| JP | 2000-150720 | 5/2000 |
| KR | 1999-34053 | 5/1999 |
| KR | 1999-34054 | 5/1999 |
| TW | 328156 | 5/1998 |
| WO | 96/01524 | 1/1996 |

* cited by examiner

*Primary Examiner*—Laura M Schillinger
(74) *Attorney, Agent, or Firm*—Scully, Scott, Murphy & Presser, P.C.

(57) ABSTRACT

The lower end of a resin wall is bonded to a radiating plate, and a lead is fixed so as to extend through the resin wall. After a semiconductor chip is bonded thereto, a resin lid is put to seal the semiconductor chip. Recessed parts for burying the lower end of the resin wall are formed on the side parts of the radiating plate, and protruding parts are further provided within the recessed parts. The lead has holes formed on the package outer part and the resin wall inner part. The loading surface of the semiconductor chip is finished with silver plating, and the package exterior and the lead are plated with gold. The shape fitted to the resin wall is imparted to the resin lid, and the resin lid is further formed into a vertically plane symmetric shape.

2 Claims, 12 Drawing Sheets

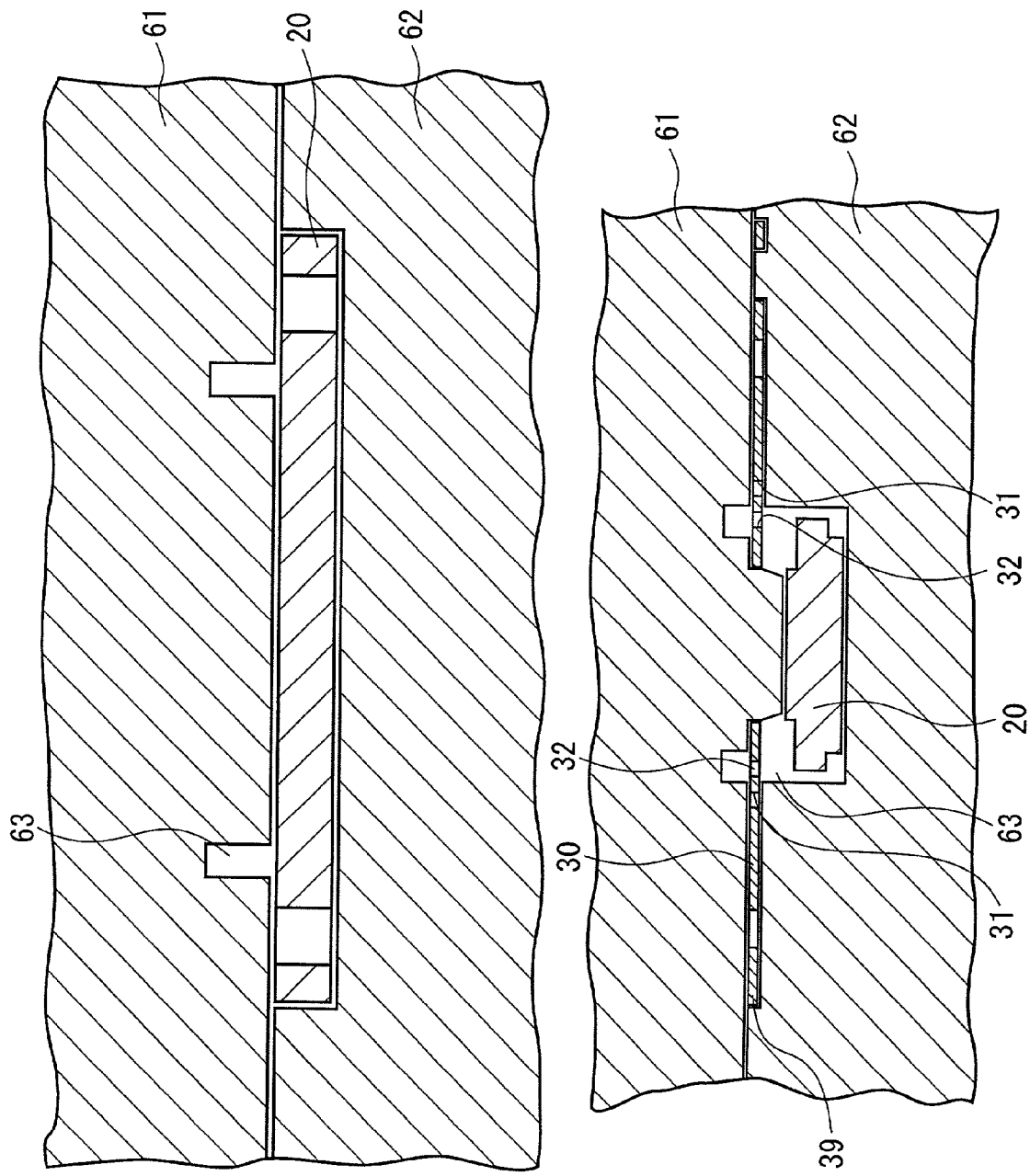

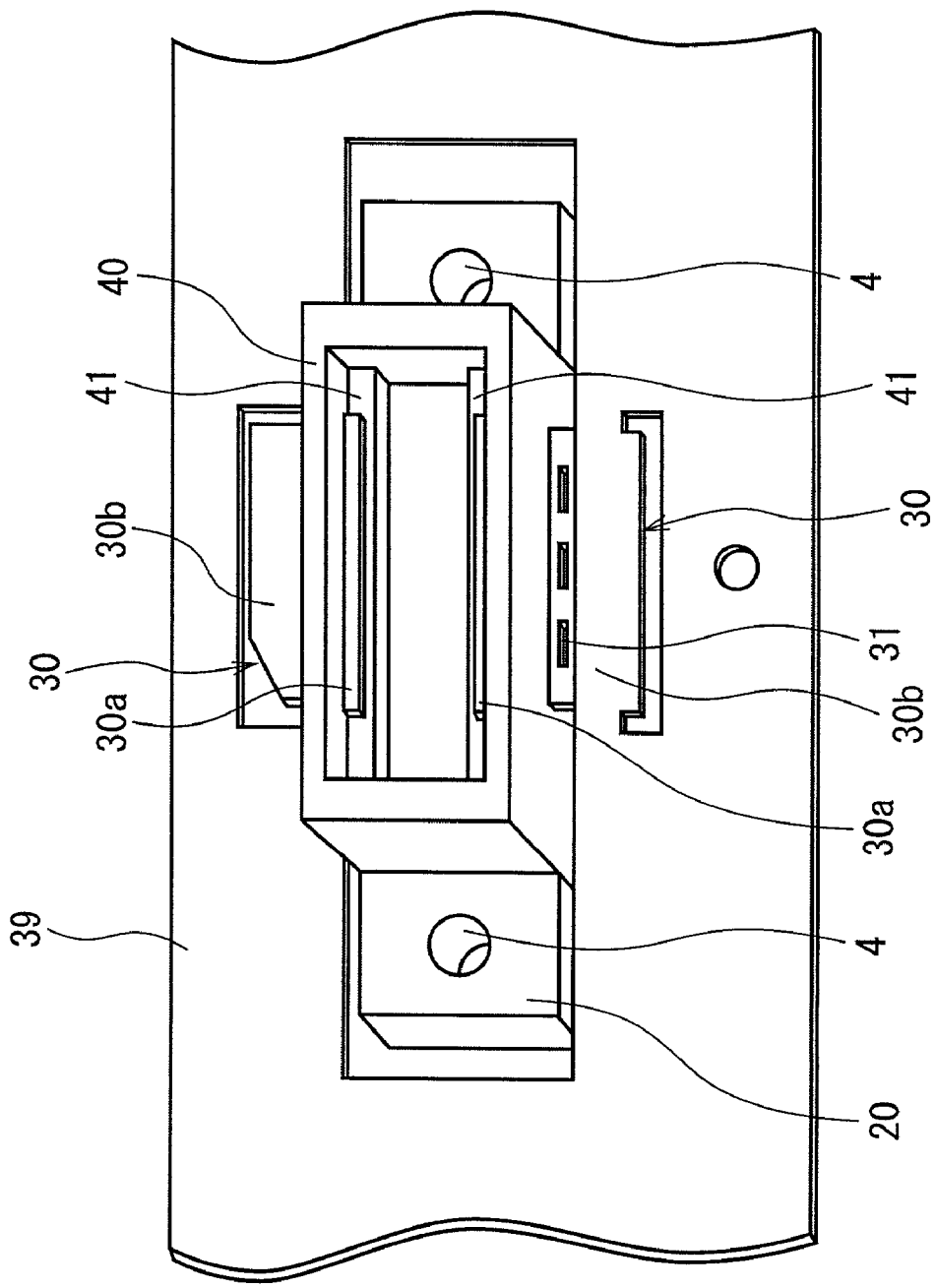

SEMICONDUCTOR DEVICE IN A RESIN SEALED PACKAGE WITH A RADIATING PLATE AND MANUFACTURING METHOD THEREOF

BACKGROUND OF THE INVENTION

1. Technical Field of the Invention

The invention relates to a semiconductor device and a manufacturing method thereof and, particularly, to a semiconductor device having a semiconductor chip bonded to a radiating plate and sealed with resin [resin-sealed package equipped with radiating plate (plastic package)] and a manufacturing method thereof.

2. Description of the Related Art

In a transistor for large power, generally, a radiating plate made of copper or the like is used in order to enhance the heat radiating property because the transistor generates a large heating value. A semiconductor device having a semiconductor chip bonded to such a radiating plate and sealed with resin, or a resin-sealed package equipped with radiating plate (plastic package) has a structure, for example, as shown in FIG. 1. FIG. 1 is a partially cutaway perspective view of a conventional resin-sealed package equipped with radiating plate.

A semiconductor device 10 shown in FIG. 1 is a resin-sealed package equipped with a radiating plate 2, which comprises a semiconductor chip 1, the radiating plate 2, a lead 3 and a sealing resin 5. The radiating plate 2 is formed of a metal plate such as copper and its alloy, which is plated with silver or the like. The lead 3 is solely formed by a lead frame. The sealing resin 5 is a thermosetting resin such as epoxy resin or the like. The semiconductor chip 1 is a transistor for large power.

The semiconductor device 10 is generally manufactured as follows. The semiconductor chip 1 is put on and bonded to the radiating plate 2, and the electrode (not shown) of the semiconductor chip 1 provided on its bonding surface side is electrically connected to the radiating plate 2. Electrodes 6 provided on the upper surface of the semiconductor chip 1 are connected to the inner lead part 3a of the lead 3 through bonding wires 7. Thereafter, these are put in a metal mold, the area provided with the semiconductor chip 1 of the radiating plate 2 and the periphery thereof are housed in the cavity of the metal mold, and the sealing resin 5 is filled therein and molded.

The semiconductor device 10 thus has a structure in which the sealing resin 5 is filled in the package, and the semiconductor chip 1, the bonding wires 7 and the inner lead part 3a are closely fitted to the sealing resin 5 and covered with the sealing resin 5. The outer lead part 3b of the lead 3 is protruded out of the package to form an external terminal.

The radiating plate 2 often comprises screw holes 4 for fixing the semiconductor device 10 to an aluminum chassis in the mounting of the semiconductor device.

A conventional ceramic package is described in reference to FIG. 2. FIG. 2 is a partially cutaway perspective view of a conventional ceramic package equipped with radiating plate.

A semiconductor device 11 shown in FIG. 2 has a ceramic package equipped with a radiating plate 2, which comprises a semiconductor chip 1, the radiating plate 2, a lead 3, a ceramic frame 8, and a ceramic cap 9.

The ceramic frame 8 is brazed, as shown in FIG. 2, to the center of one main surface of the radiating plate 2. Two leads 3 are brazed to the upper surface of the ceramic frame 8 opposing to each other. The leads 3 are brazed to the ceramic frame 8 so that one-side ends (inner lead parts 3a) of the leads 3 and the other ends (outer lead parts 3b) thereof are protruded to the inside and outside of the ceramic frame 8, respectively. The semiconductor chip 1 is put on and bonded to the area surrounded by the ceramic frame 8 of the radiating plate 2, and the electrode (not shown) of the semiconductor chip 1 provided on its bonding surface side is electrically connected to the radiating plate 2. Electrodes 6 on the upper surface of the semiconductor chip 1 are connected to the inner lead parts 3a of the leads 3 through bonding wires 7. The ceramic cap 9 is fixed to the upper end of the ceramic frame 8 to airtightly seal the semiconductor chip 1, the bonding wires 7 and the inner leads 3a. Namely, the semiconductor chip 1, the bonding wires 7 and the inner leads 3a are airtightly sealed in the hollow structure formed by the radiating plate 2, the ceramic frame 8, and the ceramic cap 9.

The conventional resin-sealed package equipped with radiating plate, however, had the following problems.

The resin-sealed package equipped with radiating plate is used for a semiconductor element with large heating value such as power MOSFET used in an analog amplifier or the like. The temperature of the chip surface is often raised by the heat generated in the high output operation of the semiconductor element to deteriorate or peel the sealing resin closely fitted to the chip surface, which causes the problem that the reliability of the semiconductor device is deteriorated by its characteristic change.

Since the semiconductor chip surface and the bonding wires are covered with the sealing resin, a parasitic capacity based on the sealing resin as dielectric layer is generated. The interference of the parasitic capacity often causes the deterioration of characteristics, for example, in a high frequency band of 1 GHz or more. Accordingly, the problem of deterioration of high frequency characteristics arises in the use for microwave.

The use of the ceramic package is free from such problems, but cannot enjoy the characteristic advantage of the resin-sealed package as described below.

Conventionally, a metal package, a ceramic package and the like have been used for the transistor for large power from the viewpoint of reliability, but it is desired to realize a package sufficiently reliable to the transistor for large power by use of a resin-sealed package (plastic package) made of inexpensive and highly productive molding resin.

The ceramic package can certainly realize high reliability and high performance, compared with the resin-sealed package. However, the ceramic package requires a high manufacturing cost including materials, compared with the resin-sealed package.

The adjustable or selectable range of thermal expansion coefficient in ceramic materials is narrow, compared with resin materials. Therefore, the materials of other members (metal, semiconductor and the like) constituting the semiconductor device which can be used is restricted in a narrow range, or the improvement in reliability by the matching of thermal expansion coefficient is difficult to attain.

Expensive materials such as tungsten copper, molybdenum copper and the like tend to correspond to the materials matched in thermal expansion coefficient to the ceramic materials, and the selectable range of materials is too narrow to select an inexpensive material. The material cost runs up also in this point.

At the present time when the resin-sealed package is becoming the mainstream wedging, makers having ceramic package techniques and facilities therefor are few and specialized, compared with markers having resin mold techniques and facilities therefor. Accordingly, if the resin-sealed package can be substituted with respect to the semiconductor device in which the ceramic package was conventionally adapted, a large-scaled reduction in cost can be expected.

It is desired to extend the application of the resin-sealed package to the use for the transistor for large power or the like, which was the weak point of the resin-sealed package, to inexpensively provide a semiconductor device such as transistor for large power to which high reliability by use of inexpensive and highly productive resin mold package techniques is required.

SUMMARY OF THE INVENTION

The present invention has an object to provide a semiconductor device improved in the reliability and performance of a resin sealed package equipped with radiating plate and a manufacturing method thereof. Further, the present invention has another object to apply the resin-sealed package to a transistor for large power to inexpensively provide it.

More specifically, the present invention has the following objects:

to improve the reliability in high output operation;

to improve the characteristic in high frequency operation;

to improve the adhesion of a resin member to a radiating plate;

to improve the adhesion of the resin member to a lead;

to improve the airtightness and moisture resistance, particularly, to prevent the penetration of moisture, flux, molten solder, corrosive gas or the like from the interface of the lead and the resin member;

to moderate the stress propagated from an outer lead to a resin package body in the cutting of a lead frame or in the mounting of the semiconductor device to keep the bonding force between the lead and the resin member;

to reduce the cost required for external plating while keeping the external corrosion resistance of the semiconductor device by the plating;

to facilitate the assembling in packaging and improve the assembling precision; and to reduce the warping of the resin member by temperature change.

The semiconductor device according to the first aspect of the present invention comprises a radiating plate; a semiconductor chip bonded onto the radiating plate; a resin wall bonded at the lower end to the radiating plate to surround the circumference of the semiconductor chip; a conductive member extended through the resin wall and retained by the resin wall to electrically conduct the semiconductor chip to the outside; and a resin lid bonded to the upper end of the resin wall. The semiconductor chip is sealed in the space blocked by the radiating plate, the resin wall and the resin lid.

According to the semiconductor device of the first aspect of the invention, the semiconductor chip can be sealed in the hollow structure in no contact with the resin member (in the state isolated therefrom). Therefore, even if the temperature of the chip surface is raised by the heating in high output operation of the semiconductor element, the characteristic of the semiconductor device can be kept without deteriorating the resin member, and the reliability in high output operation can be advantageously improved.

Even when a bonding wire is used for the connection of the semiconductor chip to the conductive member (lead), the bonding wire can be sealed in the hollow structure in no contact with the resin member (in the state isolated therefrom). Therefore, the high frequency characteristic can be advantageously improved without generating the parasitic capacity based on the resin as dielectric layer.

A semiconductor device according to the second aspect of the present invention comprises: a conductive member formed by a lead frame; a radiating plate formed of a metal plate different from the lead frame; a semiconductor chip bonded onto the radiating plate; a resin wall bonded at the lower end to the radiating plate, which retains the conductive member and surrounds the circumference of the semiconductor chip; and a resin lid bonded to the upper end of the resin wall. The semiconductor chip is sealed in the space blocked by the radiating plate, the resin wall and the resin lid. And the conductive member electrically conducts the semiconductor chip to the outside.

According to the semiconductor device of the second aspect of the invention, since the radiating plate is formed of the metal plate different from the lead frame, the radiating plate can be formed by use of a metal plate different in thickness from the metal sheet constituting the lead frame. Thus, the radiating plate can be formed of a metal plate thicker than the metal sheet constituting the lead frame to advantageously enhance the heat radiating property.

Since a plurality of semiconductor devices are assembled on the same lead frame, the carrying in the manufacturing process is advantageously facilitated.

A semiconductor device according to the third aspect of the present invention is characterized by fitting, in a semiconductor device according to the first or second invention, the resin wall to protruding parts or recessed parts provided on the radiating plate.

According to the semiconductor device of the third aspect of the invention, since the resin wall is fitted to the protruding parts or recessed parts provided on the radiating plate, the adhesive area of the radiating plate to the resin can be extended to advantageously improve not only the adhesion of the radiating plate to the resin wall but also the airtightness of the package.

The structure having the combination of protruding parts with recessed parts is also effective. For example, a semiconductor device according to the fourth invention of the application is effective.

The semiconductor device according to the fourth aspect of the present invention is characterized by providing, in a semiconductor device according to the first or second invention, recessed parts on the opposed side parts of the radiating plate, protruding and providing protruding parts on the inner surfaces of the recessed parts, and burying the lower end part of the resin wall in the recessed parts.

A semiconductor device according to the fifth aspect of the present invention is characterized by providing, in a semiconductor device according to the first or second invention, holes in the outside positions of the resin wall on the conductive member.

According to the semiconductor device of the fifth aspect of the invention, since the holes are provided in the outside positions of the resin wall on the conductive member, the rigidity of the conductive member in the positions having such holes is reduced, so that the stress propagated from the outer lead to the resin package body in the cutting of the lead frame or in the mounting of the semiconductor device can be moderated. Consequently, the bonding force of the conductive member to the resin member can be advantageously kept.

A flux or molten solder often penetrates to the bonding interface of the resin and the conductive member and further into the package through the bonding interface. According to the semiconductor device of the fifth aspect of the invention, the flow of the flux or molten solder running over the conductive member outside the package to the package outer surface (the resin wall outer surface) can be entirely or partially stopped by the holes provided in the outside positions of the resin wall on the conductive member. Namely, it can be advantageously reduced that the flux or molten solder flowing on the conductive member outside the package reaches the bonding part of the conductive member to the resin wall, compared with the case having no hole. Consequently, the penetration of the flux or molten solder to the bonding interface of the resin and the conductive member and further into the package through the bonding interface can be advantageously reduced.

A semiconductor device according to the sixth aspect of the present invention is characterized by providing, in a semiconductor device according to the first or second aspect of the invention, first holes in the outside positions of the resin wall on the conductive member, and providing second holes or cutouts in the region extending through the resin wall of the conductive member.

According to the semiconductor device of the sixth aspect of the invention, the same advantage as the fifth invention can be provided by the first holes. Further, since the resin constituting the resin wall is partially filled in the second holes or cutouts provided on the conductive member and hardened therein, the dropping-out of the conductive member can be prevented by the anchor effect to advantageously improve the adhesive strength and bonding strength of the resin wall to the conductive member.

According to the semiconductor device of the sixth aspect of the invention, further, since the bonding interface of the resin and the conductive member can reduced, compared with the case having no second hole or cutout, to narrow or extend the penetrating route of the moisture, flux, molten solder, corrosive gas or the like into the package from the outside, the penetration of the moisture, flux, molten solder, corrosive gas or the like to the bonding interface of the resin and the conductive member and further into the package through the bonding interface can be advantageously reduced.

A semiconductor device according to the seventh aspect of the present invention is characterized by arranging, in the semiconductor device of the sixth invention, the first holes so as to overlap the space area of the second holes or cutouts when the conductive member is seen down in the resin wall direction from the outside of the resin wall.

According to the semiconductor device of the seventh aspect of the invention, the penetrating route of the flux or molten solder into the package from the outside can be more narrowed or extended. The flow of the fluid of the flux or molten solder flowing on the conductive member outside the package to the package outer surface (resin wall outer surface) can be stopped by the first holes, and even if the flux or molten solder partially flows to the space area of the first holes and reaches the package outer surface (resin wall outer surface), the penetration of the flux or molten solder to the bonding interface of the resin and the conductive member and further into the package through the bonding interface can be advantageously prevented by the second holes or cutouts.

A semiconductor device according to the eighth aspect of the present invention is characterized by providing, in a semiconductor device according to the first or second invention, a stepped part to be fitted to the inner periphery of the resin wall on the resin lid.

The semiconductor device of the eighth aspect of the invention has the advantage that the resin lid can be easily and precisely put on the resin wall.

A semiconductor device according to the ninth aspect of the present invention is characterized by forming, in the semiconductor device of the eighth invention, the resin lid so as to have a vertically plane symmetric shape.

According to the semiconductor device of the ninth aspect of the invention, the stepped part plane symmetric to the stepped part to be fitted to the inner periphery of the resin wall provided on the lower surface of the resin lid (package inside surface) is provided on the upper surface (package outside surface) of the resin lid. Therefore, the section vertical to the plane direction of the resin lid has an equal shape, so that the warping of the resin lid by temperature change can be advantageously reduced.

A semiconductor device according to the tenth aspect of the present invention is characterized by finishing, in a semiconductor device according to the first or second invention, the surface of the radiating plate surrounded by the resin wall by silver plating, and surface-finishing the other surface of the radiating plate except the part for bonding the resin wall and the inner lead part and outer lead part of the conductive member by gold plating.

According to the semiconductor device of the tenth aspect of the invention, the base metal and base plating are protected from moisture or the like by the gold plating applied to the exterior, and the external corrosion resistance of the semiconductor device can be advantageously improved. Since the surface of the radiating plate surrounded by the resin wall is finished not by gold plating but by silver plating, the cost required for the plating can be advantageously reduced. Further, since the inner lead part and outer lead part of the conductive member are surface-finished by gold plating, the migration resistance can be advantageously improved. As the whole, the reliability can be improved while reducing the cost.

A manufacturing method of semiconductor device according to the eleventh aspect of the present invention comprises the steps of: forming a conductive member by a lead frame; arranging the lead frame and a radiating plate in a metal mold having a cavity corresponding to a resin wall; clamping the region of the radiating plate, the region forming the inside of the resin wall, by an upper die and a lower die of the metal mold; and molding a resin in the mold to form the resin wall.

According to the manufacturing method of semiconductor device according to the eleventh aspect of the present invention, since the region forming the inside of the resin wall of the radiating plate is clamped by the upper die and lower die of the metal mold, the radiating plate can be advantageously flattened by the clamping force. When the end part of the radiating plate is protruded to the region forming the outside of the resin wall, such an end part is also clamped by the upper die and lower die of the metal mold. Since the radiating plate can be retained within the metal mold even if the end part of the radiating plate is not protruded to the region forming the outside of the resin wall in the manufacturing method of semiconductor device of the eleventh invention, a behavior such as the floating of the radiating plate or the like within the metal mold can be suppressed, and the radiating plate can be advantageously flattened by the clamping force.

A manufacturing method of semiconductor device according to the twelfth aspect of the present invention comprises the steps of: forming a conductive member by a lead frame; forming a radiating plate by a metal plate different from the lead frame; arranging the lead frame and the metal plate within a metal mold having a cavity corresponding to the resin wall; molding a resin in the mold to form the resin wall and then opening the mold; and plating the radiating plate and the conductive member.

A manufacturing method of semiconductor device according to the thirteenth aspect of the present invention further comprises the steps of: as the plating step in the manufacturing method of semiconductor device of the twelfth aspect of the invention, electroplating the radiating plate with silver; electroplating the conductive member with gold; and electroplating the region forming the outside of the rein wall of the radiating plate with gold.

According to the manufacturing method of semiconductor device of the twelfth aspect of the invention or the thirteenth aspect of the invention, the semiconductor device according to the tenth aspect of the invention can be effectively manufactured. Since the radiating plate is formed of a metal plate different from the lead frame used, the lead and the radiating plate can be constituted in the electrically isolated state, and the lead frame and the radiating plate can be independently electroplated without particularly using any mask in the plating process.

In the invention, the hollow package is formed by the radiating plate, the resin wall, and the resin lid, and the shapes of the radiating plate, the lead and the resin lid, the plating method and the like are designed as described above, whereby the assembling in packaging is facilitated, and the assembling precision is improved. The resin sealed package is applied to a transistor for large power or the like, whereby it can be inexpensively proposed.

BRIEF DESCRIPTION OF THE DRAWINGS

FIG. 9A is a sectional view of a molding metal mold corresponding to the section taken along the line A-A in FIG. 8A, and FIG. 9B is a sectional view of the molding metal mold corresponding to the section taken along the line B-B in FIG. 8B.

FIG. 10 is a perspective view of the semiconductor device 12 according to the first embodiment of the present invention after mold release in the course of manufacturing.

THE DETAILED DESCRIPTION OF THE PREFERRED EMBODIMENTS

The semiconductor device according to preferred embodiments of the present invention and the manufacturing method thereof are described in more detail in reference to the accompanying drawings. The following merely shows an example of the invention and never limits the invention.

First Embodiment

Figure 1:
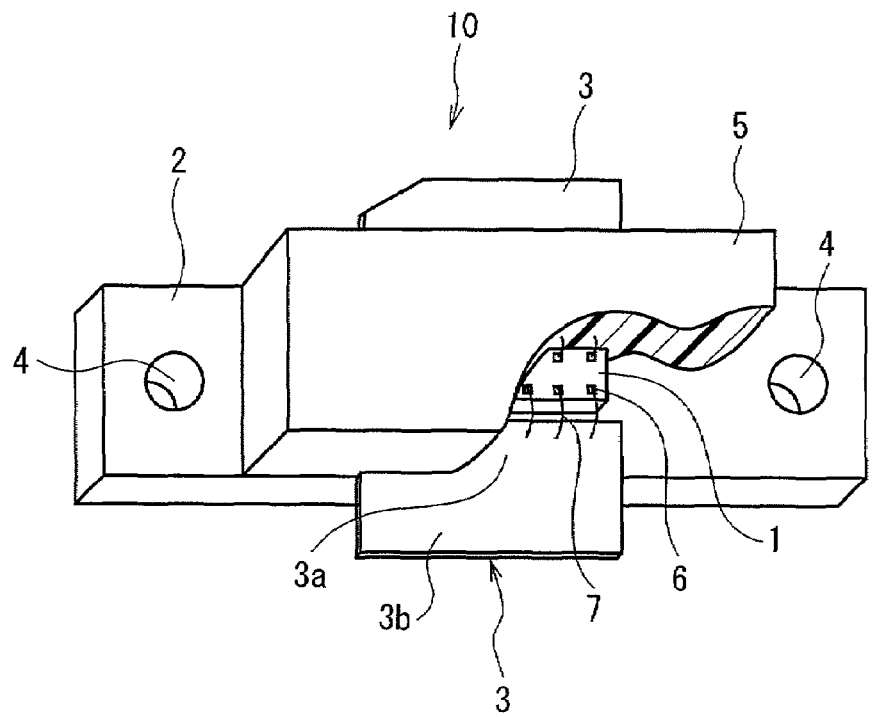
FIG. 1 is a partially cutaway perspective view of a conventional resin-sealed package equipped with radiating plate.
Figure 2:
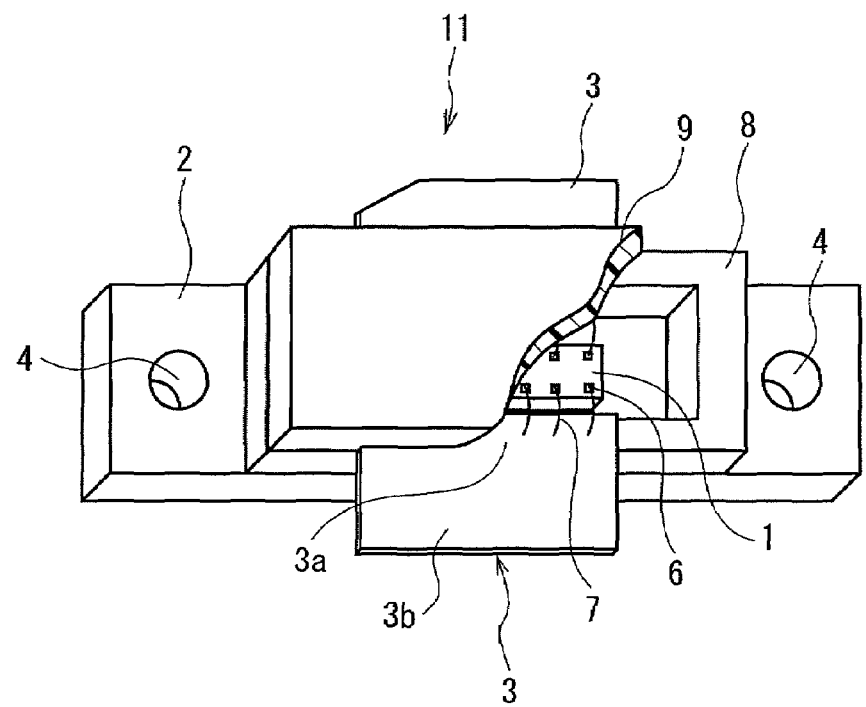
FIG. 2 is a partially cutaway perspective view of a conventional ceramic package equipped with radiating plate.
Figure 3:
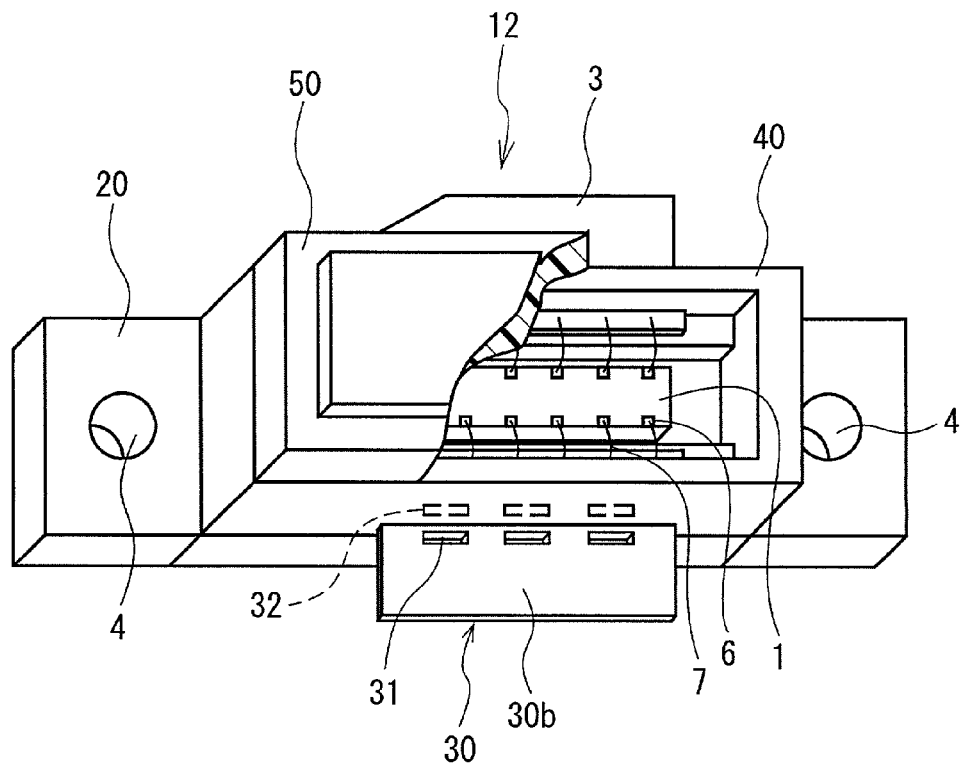
FIG. 3 is a partially cutaway perspective view of a semiconductor device 12 according to the first embodiment of the present invention.

The structure of the semiconductor device 12 according to the first embodiment of the invention is described in reference to FIGS. 3-8. FIG. 3 is a partially cutaway perspective view of the semiconductor device 12 according to the first embodiment of the invention.

As shown in FIG. 3, the semiconductor device 12 of the embodiment is a resin-sealed package equipped with radiating plate, which comprises a semiconductor chip 1, a radiating plate 20, a lead 30, a resin wall 40 and a resin lid 50. The resin wall 40 and the resin lid 50 are formed of a thermosetting resin such as epoxy resin or the like. In the embodiment, the semiconductor chip 1 is a transistor for large power.

The radiating plate 20 consists of a copper plate plated with nickel, silver and gold. The part for bonding the resin wall 40 of the radiating plate 20 is not plated, and the resin is directly adhered to the copper plate. The surface of the package exterior part (the outside of the resin wall 40) of the radiating plate 20 is surface-finished by coating nickel plating and silver plating on the base copper plate in this order and plating the outermost surface with gold. The surface of the package interior part (the inside of the resin wall 40) of the radiating plate 20 is surface-finished by plating the base copper plate with nickel and plating the nickel plating with silver (outermost surface). The radiating plate 20 has screw holes 4 bored in both the end parts corresponding to the package outside. The screw holes 4 are for fixing the semiconductor device 12 to a base material such as aluminum chassis by screws in the mounting of the semiconductor device 12.

Figure 4:
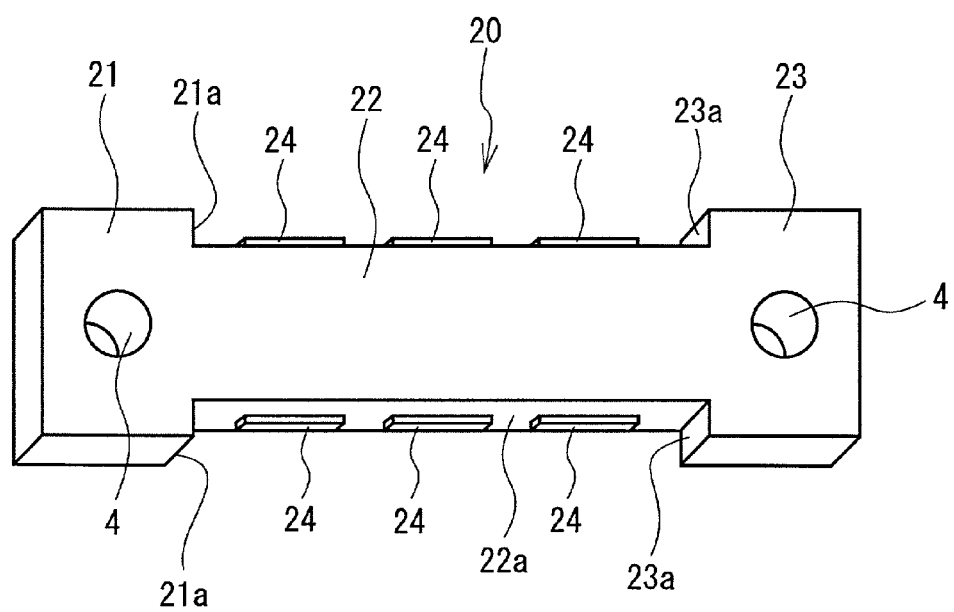
FIG. 4 is a perspective view of a radiating plate 20 constituting the semiconductor device 12 according to the first embodiment of the present invention.
Figure 5:
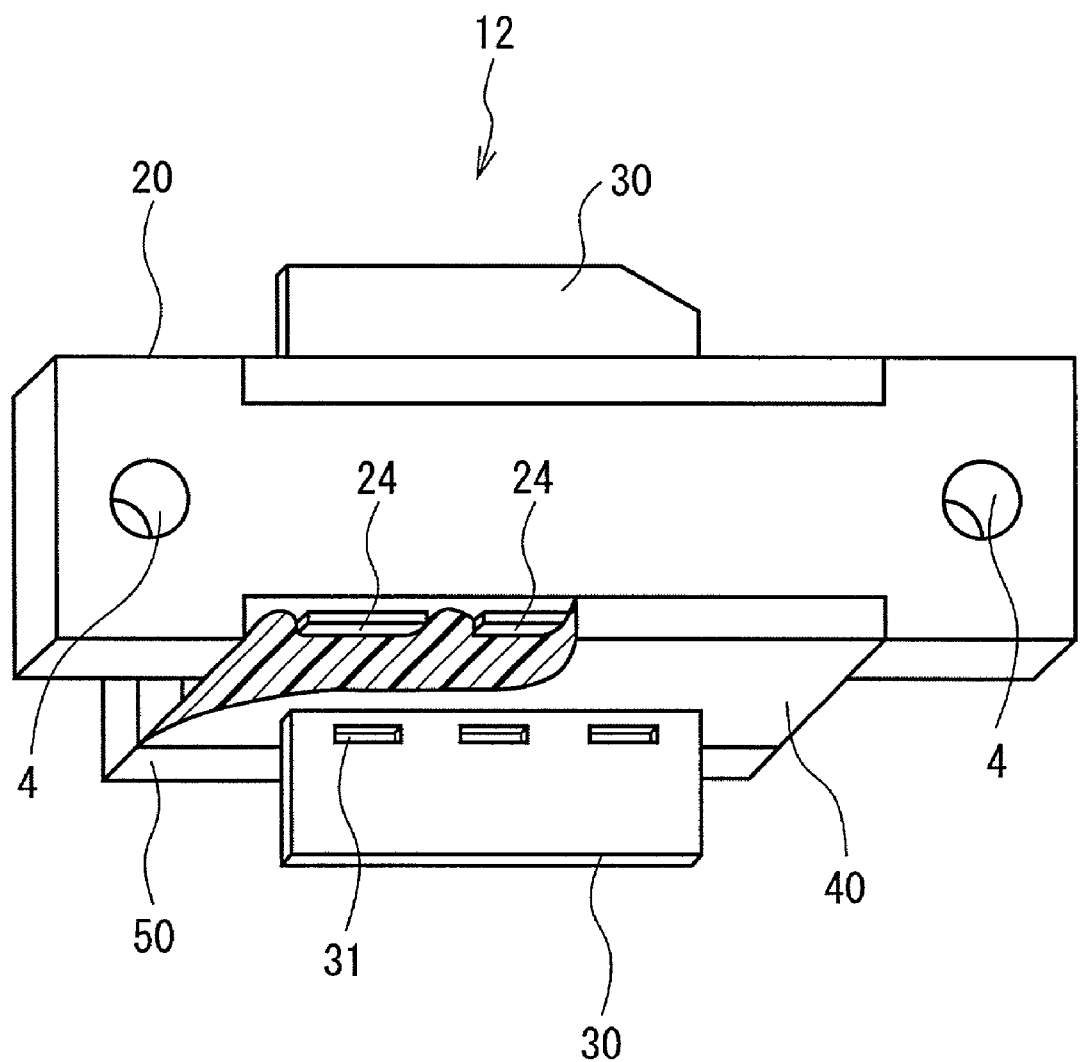
FIG. 5 is a partially cutaway perspective view of the semiconductor device 12 according to the first embodiment of the present invention seen form the bottom side.

FIG. 4 shows a perspective view of the radiating plate 20. The radiating plate 20 has an end part 21, a central part 22, an end part 23 and protruding parts 24. The center part 22 basically has a sheet-like rectangular shape. In the drawing, the lateral direction is taken as length, the vertical direction is taken as width, and the depth direction is taken as thickness. The end parts 21 and 23 are integrally and continuously formed on both longitudinal ends of the center part 22. The end parts 21 and 23 are larger in width than the center part 22 and protruded to both lateral sides from the side surfaces 22a of the center part 22 to form stepped surfaces 21a and 23a. A recessed part is formed on each of the mutually opposed side parts of the radiating plate 20 by the opposed stepped surface 21a and stepped surface 23a and the side surface 22a of the center part 22. Three protruding parts 24 each, six in total, are protruded and provided on the side surfaces 22a forming the inner surfaces of the recessed parts. The protruding parts 24 are protruded in the width direction, but the tips thereof are housed in the recessed part without protruding over the cross-directional (vertical to the width direction) end surfaces of the end parts 21 and 23. As shown in FIG. 5, the lower end of the resin wall 40 is buried in the recessed parts, and the resin wall 40 is fitted to the recessed parts and the protruding parts 24. FIG. 5 is a partially cutaway perspective view of the semiconductor device 12 according to the first embodiment of the invention seen from the bottom side.

The screw holes 4 are bored substantially in the centers of the end parts 21 and 23 toward the thickness direction.

Referring to FIG. 3 again, the lead 30 is formed of a thin plate of copper, nickel plating fitted thereto, and gold plating (outermost surface) fitted to the nickel plating for surface-finishing. The part covered with the resin wall 40 is not plated, and the resin is directly adhered to the material (copper plate). The lead 30 has first holes 31 in the outside positions of the resin wall 40.

Figure 6:
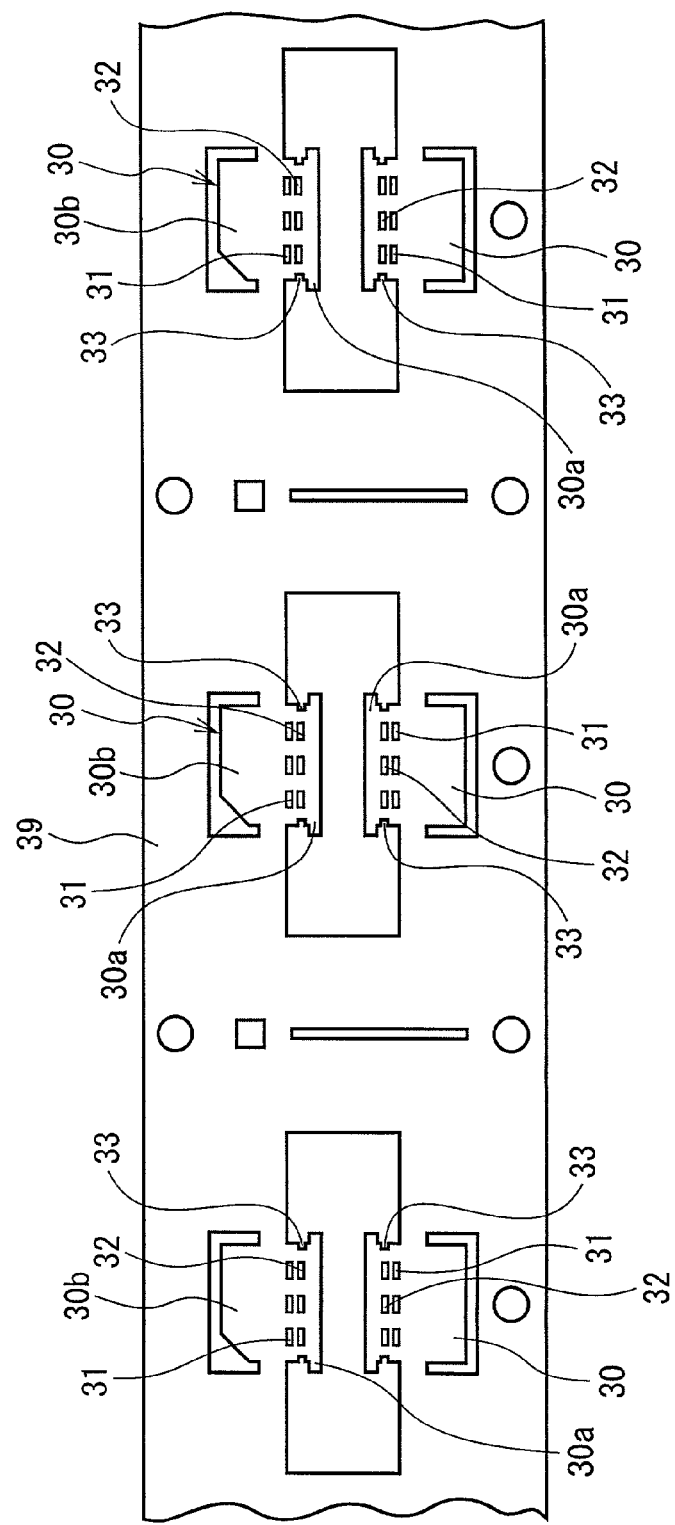
FIG. 6 is a plan view of a lead frame 39 used for the manufacturing of the semiconductor device 12 according to the first embodiment of the invention.

FIG. 6 shows a plan view of the lead frame 39. In the embodiment, the lead 30 is formed by the lead frame 39. The lead frame 39 is formed of a metal sheet of copper having the pattern of the lead 30 connected thereto. As shown in FIG. 6, the first holes 31, second holes 32 and cutouts 33 are worked in the lead 30.

Figure 7A:
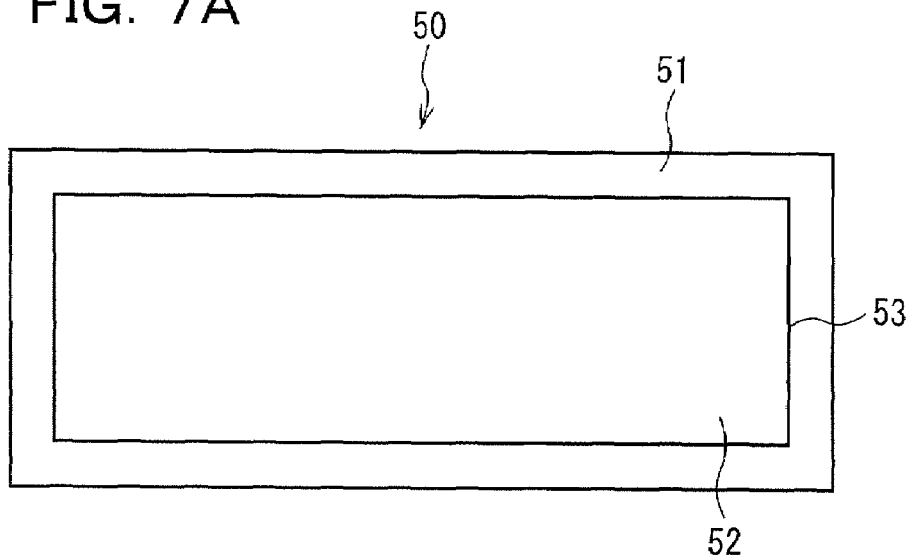
FIG. 7A is a plan view of a resin lid 50 constituting the semiconductor device 12 according to the first embodiment of the present invention.
Figure 7B:
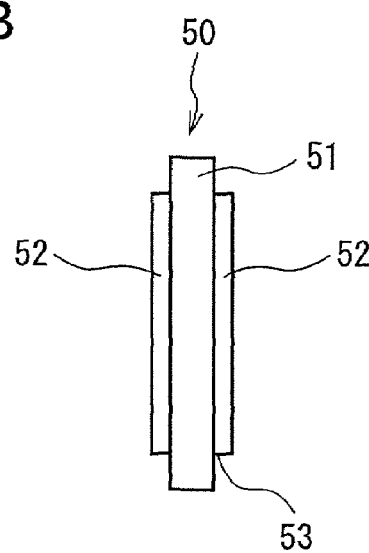
FIG. 7B is a side view thereof.
Figure 7C:
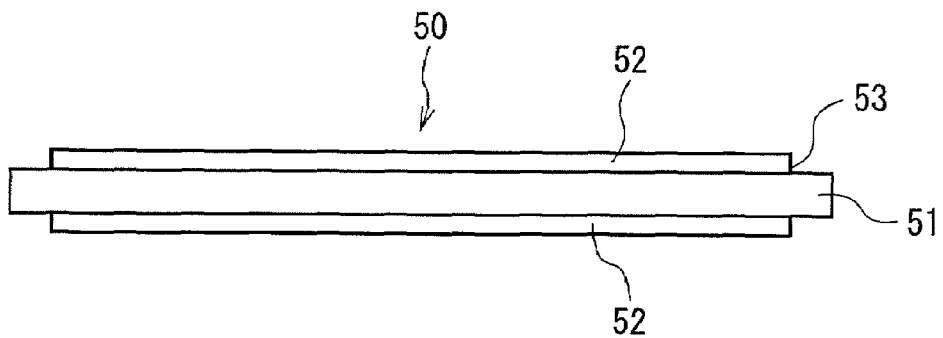
FIG. 7C is a front view thereof.

FIG. 7A is a plan view of the resin lid 50 constituting the semiconductor device 12 according to the first embodiment of the invention, FIG. 7B is a side view thereof, and FIG. 7C is a front view thereof. As apparent from FIGS. 7B and 7C, the resin lid 50 has a vertically plane symmetric shape. Protruding parts 52 are formed on both surfaces of a base part 51. Stepped parts 53 to be fitted to the inner periphery of the resin wall 40 are formed around the protruding parts 52 of both the surfaces. Namely, the outer circumferences of the protruding parts 52 are substantially conformed to the inner circumference of the resin wall 40 in both dimension and shape so as to be mutually fitted. The outer circumference of the base part 51 has a dimension and shape corresponding to the outer circumference of the resin wall 40.

Figure 8A:
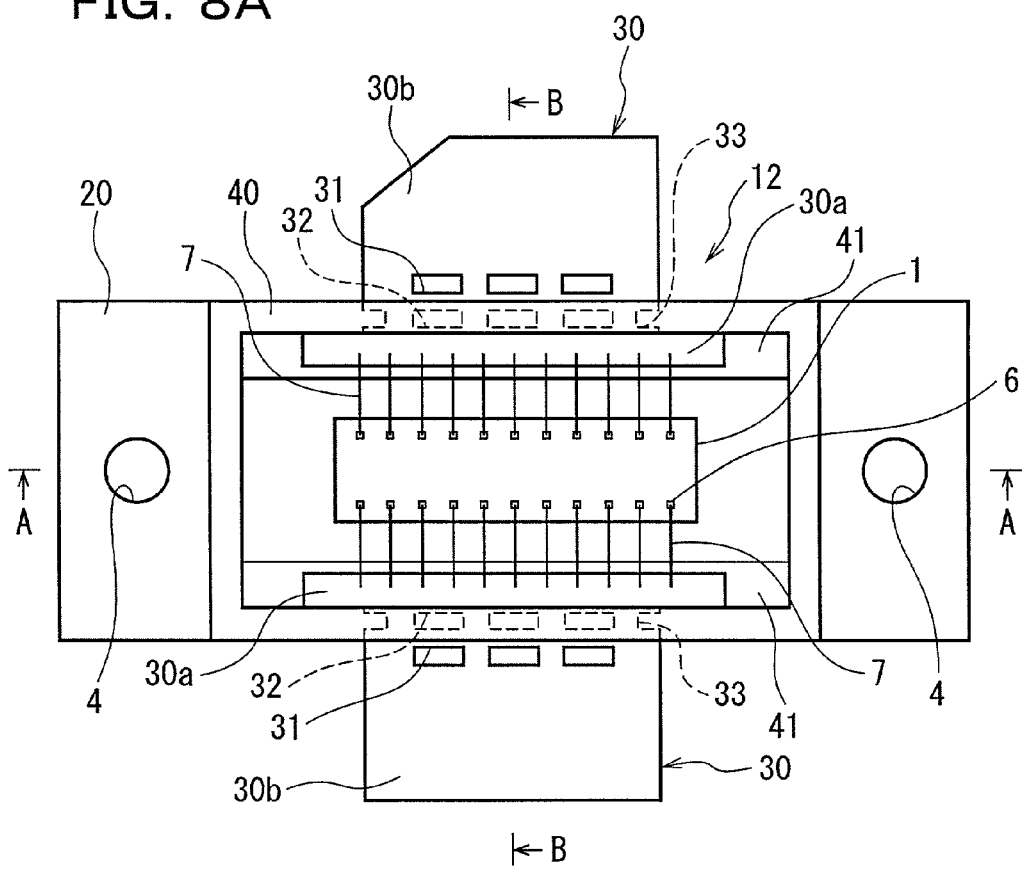
FIG. 8A is a plan view of the semiconductor device 12 according to the first embodiment of the present invention in the state where the resin lid 50 is removed.
Figure 8B:
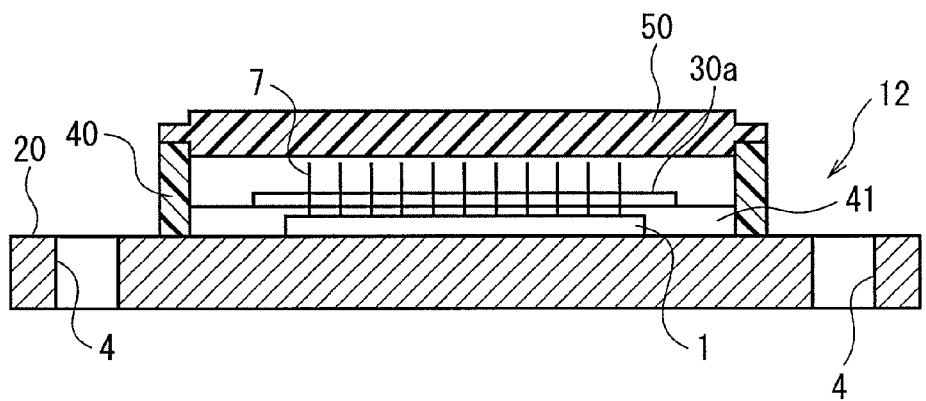
FIG. 8B is a sectional view taken along line A-A in FIG. 8A, which shows the resin lid 50.
Figure 8C:
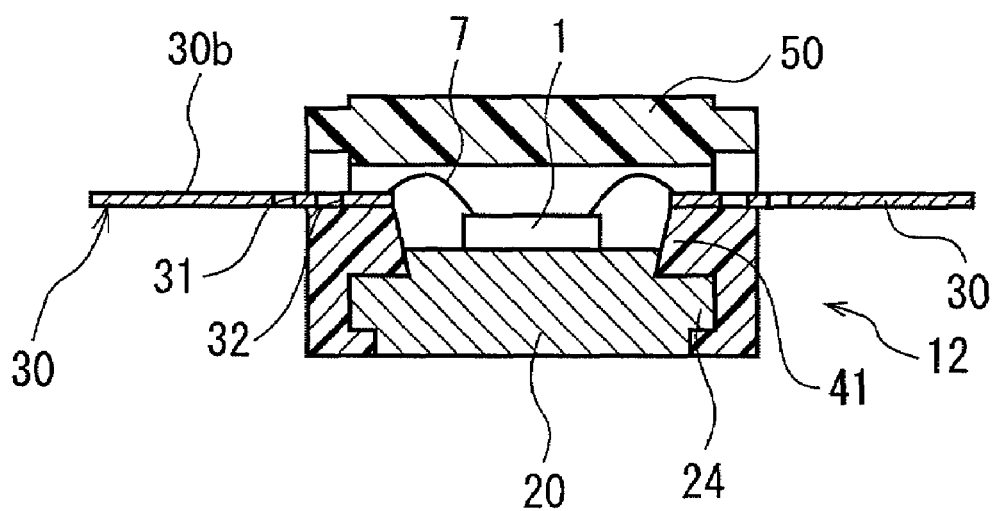
FIG. 8C is a sectional view taken along line B-B in FIG. 8A, which shows the resin lid 50.

The illustration is further performed in reference to FIGS. 8A to 8C. FIG. 8A is a plan view of the semiconductor device 12 in the state where the resin lid 50 is removed. FIG. 8B is a sectional view taken along line A-A in FIG. 8A, which shows the resin lid 50. FIG. 8C is a sectional view taken along line B-B in FIG. 8A, which shows the resin lid 50.

As shown in FIGS. 8A to 8C, the semiconductor chip 1 is bonded to the center of the radiating plate 20. The resin wall 40 surrounds the circumference of the semiconductor chip 1 and is bonded at the lower end to the radiating plate 20. The lead 30 is extended through the resin wall 40 and retained (nipped) by the resin wall 40. The second holes 32 and cutouts 33 of the lead 30 are provided within the region extending through the resin wall 40 of the lead 30. Namely, the second holes 32 and cutouts 33 are buried in the resin wall 40. The resin constituting the resin wall 40 is partially filled and hardened in the second holes 32 and cutouts 33.

The outer lead part 30b of the lead 30 is protruded from the outer wall surface of the resin wall 40 to the outside of the resin wall 40. The inner lead part 30a of the lead 30 is extended in parallel to the inner wall surface of the resin wall 40 and the radiating plate 20 on the inside of the resin wall 40 and formed broader than the outer lead part 30b to ensure the bonding area. The inner lead part 30a is supported in the state where it is loaded on a base seat part 41 formed as a part of the resin wall 40. According to this, the supporting strength of the inner lead part 30a is improved.

The inner lead part 30a is connected to the electrodes 6 of the semiconductor chip 1 through bonding wires 7 and electrically connected.

The resin lid 50 is bonded to the upper end of the resin wall 40. The protruding part of the resin lid 50 is fallen into the resin wall 40, and the resin wall 40 is fitted to the resin lid 50. The resin wall 40 is bonded to the resin lid 50 through a resin-based adhesive. As the whole, the semiconductor chip 1, the bonding wire 7 and the inner lead part 30a are sealed in the space (package) formed by the radiating plate 20, the resin wall 40 and the resin lid 50. As shown in FIGS. 8B and C, the semiconductor chip 1 and the bonding wires 7 are set within the hollow structure formed by the radiating plate 20, the resin wall 40 and the resin lid 50 without making contact with the resin.

The method for manufacturing the semiconductor device 12 of the embodiment is then described. The semiconductor device 12 is manufactured as follows.

Referring to FIGS. 9A and 9B, FIG. 9A is a sectional view of a molding metal mold corresponding to the section taken along line A-A in FIG. 8A. FIG. 9B is a sectional view of the molding metal mold corresponding to the section taken along line B-B in FIG. 8B.

The molding metal mold consisting of an upper die 61 and a lower die 62 as shown in FIGS. 9A and 9B is used. A cavity 63 corresponding to the resin wall 40 is formed by the upper die 61 and the lower die 62.

As shown in FIGS. 9A and 9B, the radiating plate 20 and the lead frame 39 are put in a prescribed position of the lower die 62. Thereafter, the upper die 61 is put thereon to close the mold. At this time, the radiating plate 20 and the lead frame 39 are clamped by the upper die 61 and the lower die 62. The radiating plate 20 is clamped not only in the outside of the resin wall forming position but also in the inside thereof. The radiating plate 20 is thus flattened.

After closing the mold, the molten resin is injected and filled in the cavity 63. The resin is also filled in the second holes 32 and cutouts 33 not shown of the lead 30. The resin is then hardened, and the mold is opened to take out the molded product. A structure consisting of the lead frame 39, the radiating plate 20 and the resin wall 40 as shown in FIG. 10 is consequently taken out.

The plating process is then performed. FIGS. 11A to 11D are typical views showing the coating process of plating in order of steps. As shown by the slash part of FIG. 11A, the exposed surfaces of the lead frame 39 including the lead 30 and the radiating plate 20 are plated with nickel.

Figure 11A:
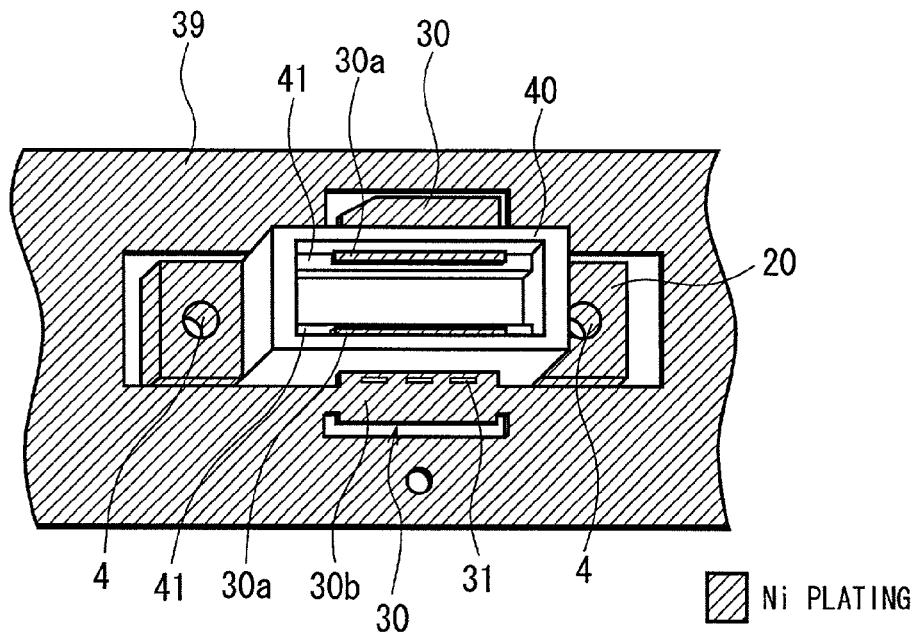
FIGS. 11A to 11D are typical views showing the coating process of plating in the manufacturing of the semiconductor device 12 according to the first embodiment of the present invention in order of steps.
Figure 11B:
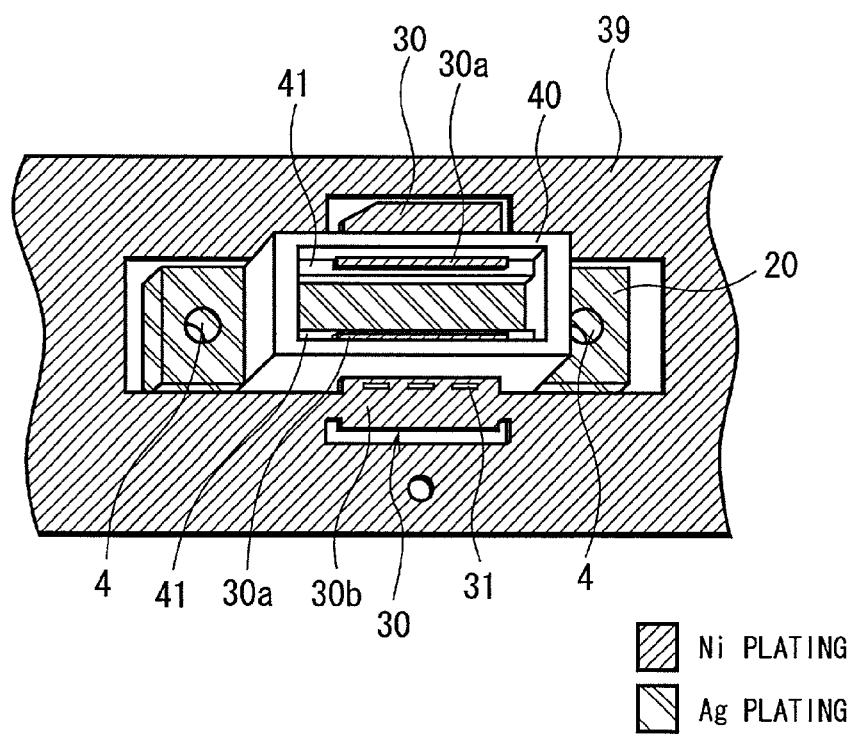

Silver plating is coated onto the nickel plating of the radiating plate 20 by electroplating as shown by the slash part of FIG. 11B. Concretely, the radiating plate 20 is dipped in a solution containing silver ion, and a silver film is electrodeposited on the surface of the nickel plating surface of the radiating plate 20 with the radiating plate 20 as negative electrode.

Figure 11C:
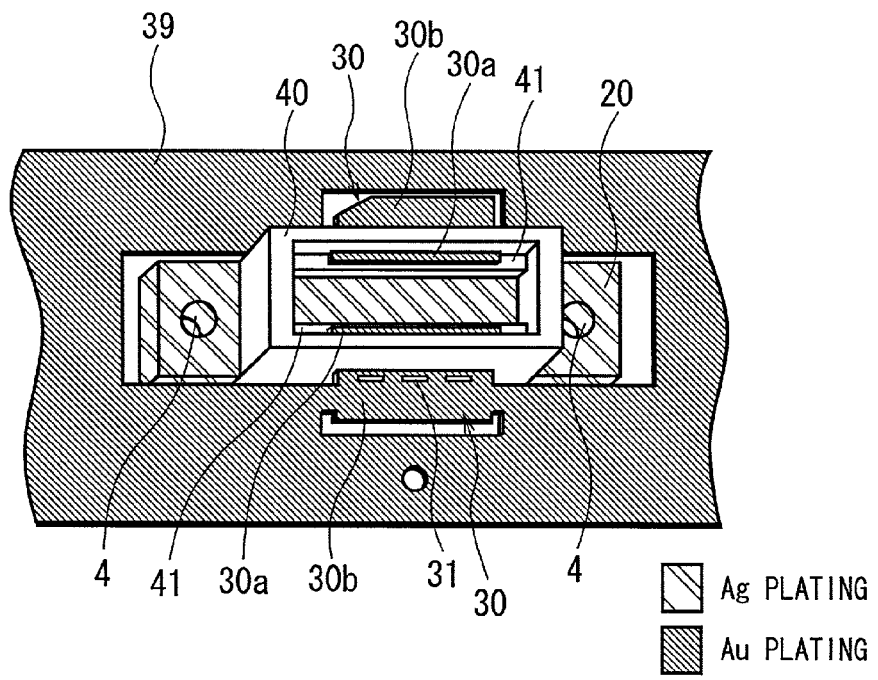

Gold plating is then coated onto the nickel plating of the lead frame 39 including the lead 30 by electroplating as shown by the slash part of FIG. 11C. Concretely, the lead 30 is dipped in a solution containing gold ion, and a metal film is electrodeposited on the nickel plating surface of the lead 30 with the lead 30 as negative electrode.

Figure 11D:
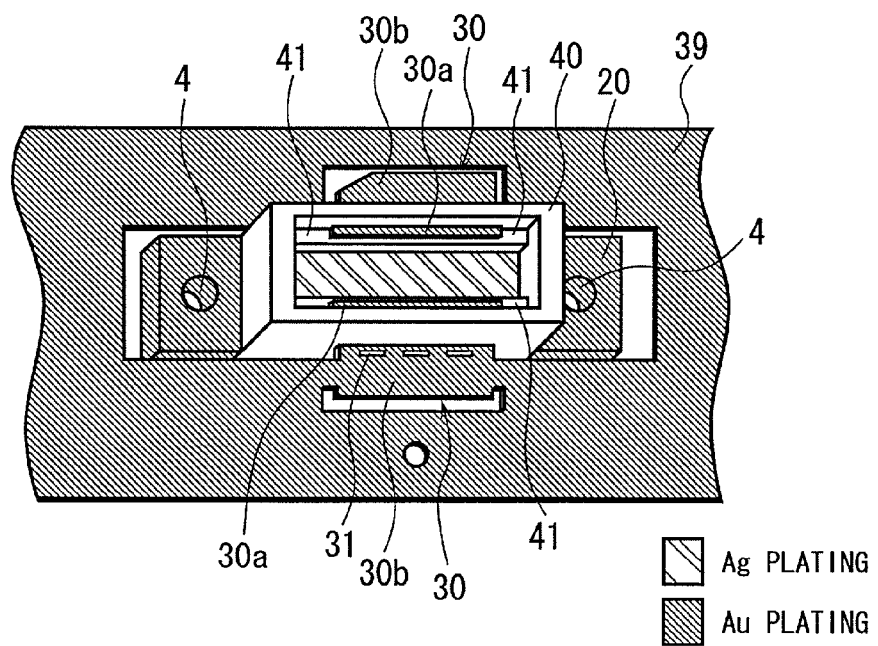

Further, gold plating is coated onto the region of the radiating plate 20, the region forming the outside of the resin wall 40 (the region forming the package exterior), by electroplating as shown by the slash part of FIG. 11D. The gold plating is thus coated onto the silver plating. Concretely, the inside (the region forming the package inside) of the resin wall 40 is masked by photoresist or the like, the radiating plate 20 is dipped in a solution containing gold ion, and a gold film is electrodeposited on the silver plating surface of the radiating plate 20 with the radiating plate 20 as negative electrode.

The semiconductor chip 1 is then bonded. Concretely, the semiconductor chip 1 is put on and bonded to the silver-plated surface of the radiating plate 20 surrounded by the resin wall 40 through a conductive die bond material, and the electrode (not shown) of the semiconductor chip 1 provided on its bonding surface side is electrically connected to the radiating plate 20.

The electrodes 6 provided on the upper surface of the semiconductor chip 1 are connected to the inner lead part 30a of the lead 30 through the bonding wires 7.

An adhesive is applied to the upper end of the resin wall 40, and the resin lid 50 is put thereon and bonded.

Thus, a plurality of semiconductor devices 12 are continuously assembled on the lead frame 39.

Further, the lead frame 39 is cut.

According to the above processes, the semiconductor device 12 as shown in FIG. 3 is obtained.

In the mounting of the semiconductor device 12, the molten solder or flux is adhered to the end part of the outer lead part 30b. Even if such a liquid flows on the lead 20 toward the outer wall surface of the resin wall 40, the flow is entirely or partially stopped by the first hole 31. Even if the liquid partially reaches the outer wall surface of the resin wall 40, the penetration of the flux or molten solder to the bonding interface of the resin wall 40 and the lead 30 and further into the package through the bonding interface is reduced by the second holes 32 and cutouts 33.

Second Embodiment

Figure 12:
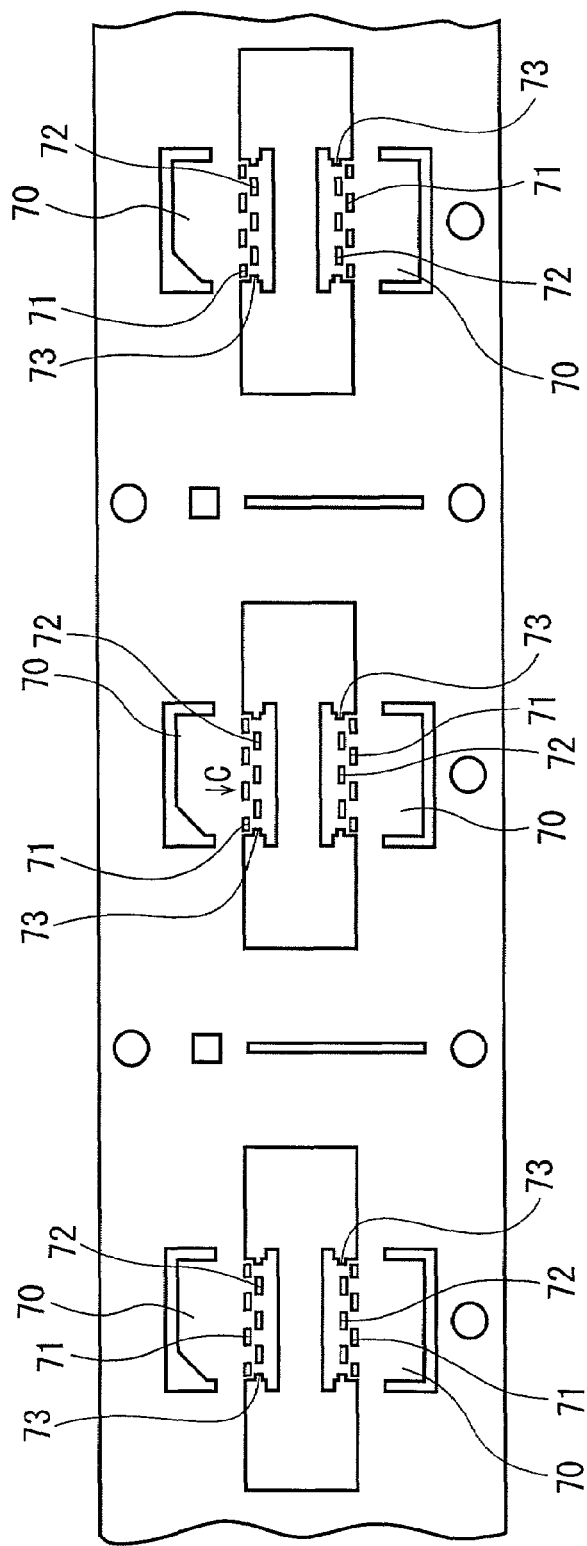
FIG. 12 is a plan view showing a lead frame in the second embodiment of the invention.

A semiconductor device according to the second embodiment of the invention is described in reference to FIG. 12. FIG. 12 is a plan view showing the lead frame of the second embodiment of the invention.

In the semiconductor device of the embodiment, a lead 70 is used instead of the lead 30 of the semiconductor device 12 of the above-mentioned first embodiment.

The lead 70 is differed in first holes 71, compared with the lead 30. The first holes 71 are arranged so as to overlap the space part between one second hole 72 and the other second hole 72 adjacent thereto and the space area between the second hole 72 and a cutout 73. According to such a structure, the flow of the liquid flowing over the lead 70 of the package outer part such as flux, molten solder or the like to the outer wall surface o the resin wall 40 can be stopped by the first holes 71, and even if the flux or molten solder partially flows to the space area between the first holes 71 and reaches the outer wall surface of the resin wall 40, the penetration of the flux or molten solder to the bonding interface of the resin and the lead 70 and further into the package through the bonding interface can be prevented by the second holes 72 or the cutouts 73.

What is claimed is:

1. A semiconductor device comprising:
a radiating plate; a semiconductor chip bonded onto the radiating plate;
a rectangular-shaped resin wall which surrounds the semiconductor chip bonded to the radiating plate, said rectangular-shaped resin wall having a first pair of opposing sides and a second pair of opposing sides;
a conductive member extending through one of the first pair of opposing sides of the resin wall and retained by the resin wall, said conductive member is electrically connected to the semiconductor chip; and a resin lid bonded to an upper end of the resin wall, said semiconductor chip is sealed in a space enclosed by said radiating plate, said resin wall and said resin lid, said radiating plate extends outward of said second pair of opposing sides of said resin wall;
wherein the radiating plate has end portions formed integrally at both ends of a center portion of the radiating plate, the lower end of the resin wall is bonded to said center portion, and said end portions are exposed through the resin wall.

2. A semiconductor device comprising:
a radiating plate;
a semiconductor chip bonded onto the radiating plate;
a rectangular-shaped resin wall which surrounds the semiconductor chip bonded to the radiating plate, said rectangular-shaped resin wall having a first pair of opposing sides and a second pair of opposing sides;
a conductive member extending through one of the first pair of opposing sides of the resin wall and retained by the resin wall, said conductive member is electrically connected to the semiconductor chip; and a resin lid bonded to an upper end of the resin wall, said semiconductor chip is sealed in a space enclosed by said radiating plate, said resin wall and said resin lid, said radiating plate extends outward of said second pair of opposing sides of said resin wall; and
wherein the surface of the radiating plate surrounded by the resin wall is surface-finished by silver plating, and the other surface of the radiating plate except the part for bonding the resin wall and the inner lead part and outer lead part of the conductive member are surface finished by gold plating.

* * * * *